US012711191B2

(12) United States Patent
Albero et al.

(10) Patent No.: US 12,711,191 B2

(45) Date of Patent: Aug. 18, 2026

(54) SYSTEM AND METHOD FOR PRE-CACHING CONTENT BASED ON DEVICE ENERGY USE

(71) Applicant: Bank of America Corporation, Charlotte, NC (US)

(72) Inventors: George Albero, Charlotte, NC (US); Naga Vamsi Krishna Akkapeddi, Charlotte, NC (US); Saurabh Arora, Gurugram (IN)

(73) Assignee: Bank of America Corporation, Charlotte, NC (US)

( * ) Notice: Subject to any disclaimer, the term of this patent is extended or adjusted under 35 U.S.C. 154(b) by 83 days.

(21) Appl. No.: 18/818,721

(22) Filed: Aug. 29, 2024

(65) Prior Publication Data

US 2026/0064791 A1 Mar. 5, 2026

(51) Int. Cl.
*G06F 16/957* (2019.01)
*G01R 31/387* (2019.01)

(52) U.S. Cl.
CPC ....... *G06F 16/9574* (2019.01); *G01R 31/387* (2019.01)

(58) Field of Classification Search
CPC .......................... G06F 16/9574; G01R 31/387
See application file for complete search history.

(56) References Cited

U.S. PATENT DOCUMENTS 9,414,222 B1 * 8/2016 Dixon .................... G06Q 10/04
9,438,526 B2 9/2016 Mihály et al.
2008/0171919 A1 7/2008 Stivoric et al.
2009/0006308 A1 1/2009 Fonsen
2010/0161831 A1 6/2010 Haas et al.
2012/0137061 A1 5/2012 Yang et al.
2013/0339345 A1 12/2013 Soto Matamala et al.
2013/0344896 A1 12/2013 Kirmse et al.
2014/0379835 A1 * 12/2014 Foerster .................. H04L 67/62 709/213
2015/0351037 A1 * 12/2015 Brown .................. G06F 1/3203 455/574
2015/0372933 A1 12/2015 Cai et al.
2015/0379157 A1 12/2015 Brown
2017/0153685 A1 * 6/2017 Li ............................ G06F 1/30
2017/0195451 A1 7/2017 Backholm
2017/0230480 A1 * 8/2017 Abadi ..................... H04W 4/50
2017/0332344 A1 11/2017 Rao et al.
2019/0053165 A1 2/2019 Luna et al.
2022/0012285 A1 1/2022 Maharajh et al.
2022/0303181 A1 9/2022 Nolan et al.

* cited by examiner

*Primary Examiner* — Clayton R Williams

(57) ABSTRACT

A system and method for pre-caching content based on device energy use that includes a memory configured to store data related to a user device and a processor operably coupled to the memory. The processor is configured to receive information regarding the current remaining energy of a user device and compare the current remaining energy to a predetermined threshold. When the current remaining energy is less than the predetermined threshold, the processor determines a second period of time associated with when the current remaining energy is estimated to be less than a second predetermined threshold. Then, the processor determines at least one action that is predicted to be performed by the user device during the second period of time. The system then sends to the user device the pre-cache data used by the user device to perform the at least one action.

20 Claims, 3 Drawing Sheets

SYSTEM AND METHOD FOR PRE-CACHING CONTENT BASED ON DEVICE ENERGY USE

TECHNICAL FIELD

The present disclosure relates generally to networked computing and, more specifically, to a system and method for pre-caching content based on device energy use.

BACKGROUND

Mobile devices are increasingly popular. They frequently rely on batteries or other energy sources that have limited capacity. They also often rely on remote servers and other computational devices to provide computations and data. Mobile devices frequently communicate with these remote servers and other computational devices using wireless networks. Communicating over wireless networks requires significant energy, and because mobile devices have limited energy capacity, this may constrain a mobile device's capability to perform desired activities when the remaining energy becomes too low.

SUMMARY

The system and method disclosed in the present application provide a technical solution to the technical problems discussed above by having a processor monitor a user device's remaining energy and determine, based on the remaining energy, what data to provide to the user device. When that energy drops below a predetermined threshold, the processor determines which activities the user may perform or are necessary to perform in a predetermined amount of time. The system determines what data is required for the user device to continue to perform those activities and sends the data as pre-cache data to the user device. The system may also instruct the user device to no longer perform unnecessary activities in order to allow the user device to continue functioning longer.

In one embodiment, the disclosed system includes a memory configured to store historical use data, energy use data, pre-cache data, and a processor operably coupled to the memory. The historical use data comprises activity information for a user device over a first predetermined period of time. The energy use data comprises energy use information for each of a plurality of actions performed by a user device when performing at least one application. The pre-cache data comprises information the user device uses to perform the plurality of actions.

The processor is configured to receive information regarding the current remaining energy of the user device and compare it to a predetermined threshold. When the current remaining energy is less than the predetermined threshold, the processor determines a second period of time associated with when the current remaining energy is estimated to be less than a second predetermined threshold. The second period of time is determined using the historical use data and energy use data. Once the second period of time is determined, the processor uses the historical use data to determine at least one action that is predicted to be performed by the user device during the second period of time, and the processor sends the user device pre-cache data used by the user device to perform that at least one action.

The disclosed system provides several practical applications, such as better managing remaining energy/battery power in a mobile device and more efficient use of that remaining energy. The disclosed system more efficiently uses a mobile device's limited storage. The disclosed system is also more efficient in the use of limited network resources by pre-caching data required in a larger data transfer rather than slowly transferring smaller blocks of data when the mobile user device requests it for immediate use. These technical advantages improve the underlying mobile computing device, network system, and backend/servers by making them faster and more energy efficient.

Certain embodiments of the present disclosure may include some, all, or none of these advantages. These advantages and other features will be more clearly understood from the following drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

System, Overview

Figure 1:
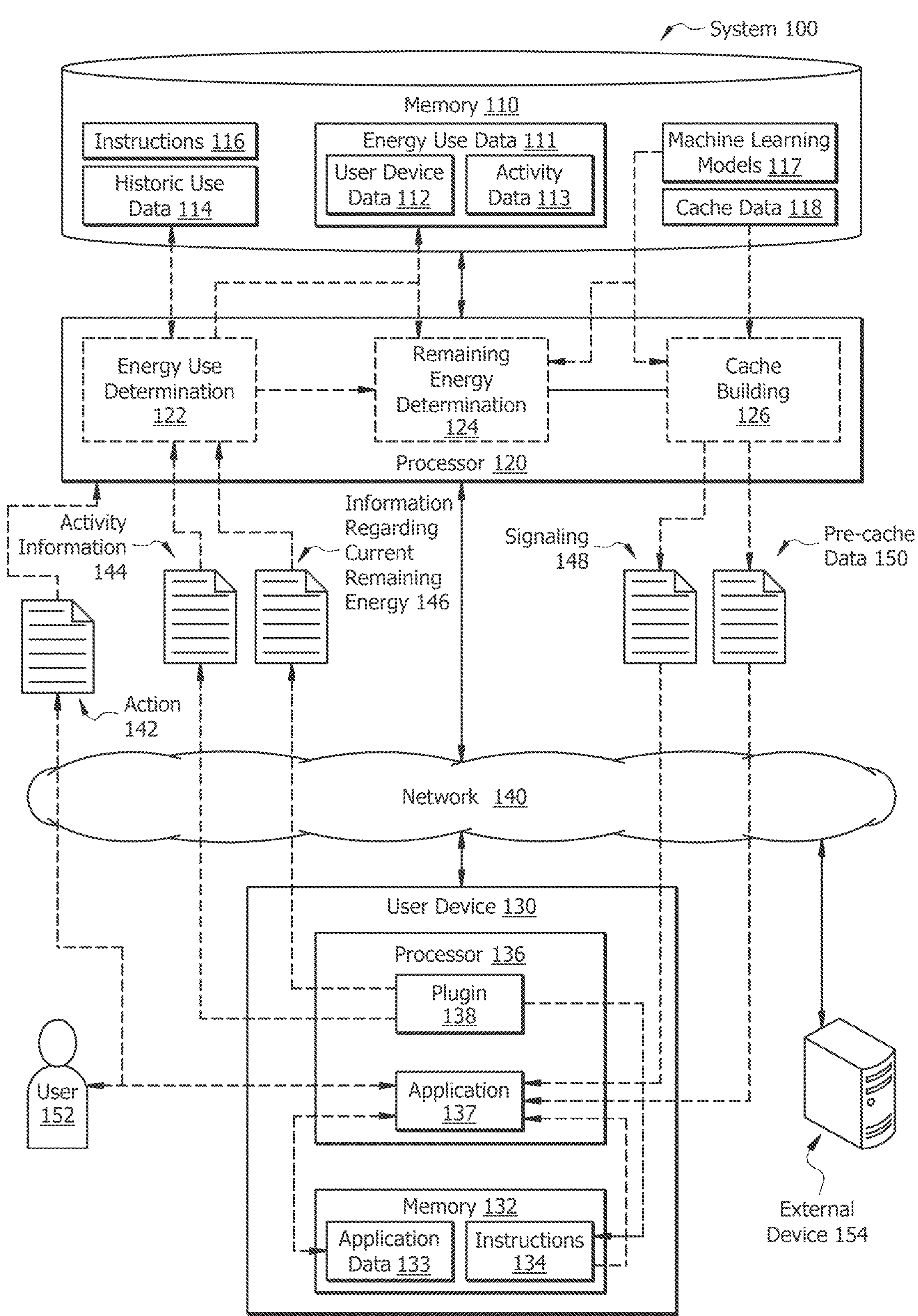
FIG. 1 illustrates one embodiment of a system for pre-caching content based on device energy use.

FIG. 1 is a schematic diagram of a system 100 configured for monitoring energy use by a user device 130 and providing pre-cached data 150 based on the user device. In one embodiment, system 100 comprises a user device 130 associated with a user 152, a network 140, a processor 120, and a memory 110. The processor 120 and memory 110 are in signal communication through the network 140 with the user device 130. The system 100 may be configured as shown or in any other suitable configuration. In general, system 100 is configured to receive activity information 144 and information regarding current remaining energy 146 from the user device 130. The processor 120 performs an energy use determination 122, a remaining energy determination 124, and cache building 126 to determine what pre-cache data 150 will be needed for the user device 130 to perform one or more actions 142. The one or more actions 142 may be any interaction or activity between the user device 130, a user 152, and/or the processor 120.

User Device

The user device 130 may include any number of devices that perform one or more applications 137. Examples of a user device 130 may include, but are not limited to, computers, laptops, mobile devices (e.g., smartphones or tablets), servers, clients, automated teller machines (ATM), point of sale devices (POS), or any other suitable type of devices that may be used for accessing or supporting an application 137. In one or more embodiments, the user device 130 may take the form of a wearable device such as, but not limited to, a smartwatch, augmented reality eyewear, or other wearable smart devices. User device 130 is not limited to a device used by a user and may be any external device, e.g., 154, where pre-caching data based on the remaining energy of the external device, e.g., 154, would be useful. While only one user device 130 is shown, in one or more embodiments, a plurality of user devices, e.g., 130, may be present, each hosting one or more applications 137 and performing one or more actions 142 that allow the user device 130 to interact with a user 152, the processor 120 or other external devices 154. In one or more embodiments, the application 137 hosted by the user device 130 may be a decentralized application and/or may take any other form and may be hosted by more than one user device, e.g., 130.

The user device 130 includes at least one processor 136 that performs one or more processes or operations, including performing applications 137 and/or actions 142, hosting a plugin 138, sending activity information 144, sending information regarding current remaining energy 146, and receiving signaling 18 and pre-cache data 150. The processor 136 executes instructions 134 stored in the memory 132 to perform the application 137, actions 142, and/or optional plugin 138. The applications 137 may include web pages, database applications, banking applications, word processing applications, entertainment applications, video applications, and/or any other applications that an organization may have hosted by the user device 130. The applications 137 may perform one or more actions 142 that interact with a user 152, for example, allowing the user 152 to enter data, check account balances, and perform other interactions with the applications 137. The applications 137 may also perform one or more actions 142 that interact with the processor 120 or external device 154, such as receiving data from the processor 120 or external device 154, such as database data.

When executing the applications 137, the processor 136 may perform various operations. The processor 136 may perform actions 142 such as making application programming interface (API) calls, performing batch jobs, modifying application data 133 stored in memory 132, and modifying application data stored in other external devices 154. The processor 136 may also perform one or more mathematical and logical operations, start and/or maintain active threads, and send and/or receive data or other information through and from the network 140. The processor 136 may perform other operations not listed above without departing from the disclosure; those listed are provided only as examples.

The processor 136, in one or more embodiments, may host an optional plugin 138 installed on the user device 130 by the processor 120 or other external systems (not shown). The optional plugin 138 may be separate or a part of the applications 137 and installed with the applications 137. Alternatively, or in addition, in one or more embodiments, the plugin 138 may be located in a separate external device 154 or in the processor 120 connected by the network 140 or by other means to the processor 136. The plugin 138 may serve as a monitoring application that monitors other applications 137 as well as the user device 130, in general, to determine its activity information 144 and information regarding current remaining energy 146 along with any other functions or actions 142 that the designer of the plugin 138 intends for it to perform.

The plugin 138 may gather information related to activity information 144 and the processor's current remaining energy 146. Activity information 144 may take the form of telemetry, one or more logs, or any other useful form. The activity information 144 may include the identification of one or more applications 137 as well as device information for the processor 136. For example, activity information 144 might indicate that the device is a specific brand, that a specific number and type of applications 137 are active on the device, and that applications 137 perform one or more actions 142. Other information may be included, and the disclosure is not limited to the activity information 144 listed above.

In one or more embodiments, the processor 136 and/or plugin 138 may also send the information regarding current remaining energy 146 to the processor 120. This may include the remaining percentage of power in a battery (not shown) or other power source associated with the user device 130. Alternatively, it may be an amount of power or energy being used at a particular time as well as a measurement of the energy being used by a user device 130.

In one or more embodiments, the processor 136, plugin 138, and/or applications 137 may receive signaling 148 and pre-cache data 150 from the processor 120. In one or more embodiments, the signaling 148 may include instructions not to perform at least one unnecessary action. However, the signaling 148 may consist of any instructions, including those to perform actions 142, modify actions 142, and/or any other instructions for the processor 136 to conduct. For example, the signaling 148 may include instructions stopping one or more applications 137 or particular actions 142 that use excessive energy or are of a lower priority at a particular time. The pre-cache data 150 is any data from an external source such as the external device 154 or processor 120 needed to perform the application 137 or one or more actions 142.

The user device 130 may include a memory 132 for storing instructions 134 for performing the applications 137, optional plugin 138, and/or actions 142. The memory 132 may also include application data 133 for the applications 137, optional plugin 138, and/or actions 142. In one or more embodiments, the memory 132 may also store the application data 133, activity information 144, pre-cache data 150, and any other useful information.

The memory 132 may be any type of storage for storing instructions 134 for executing by the processor 136 as well as application data 133 used by and/or produced by the application 137. The memory 132 may be a non-transitory computer-readable medium in operative communication with the processor 136. The memory 132 may be one or more disks, tape drives, or solid-state drives. Alternatively, or in addition, the memory 132 may be one or more cloud storage devices. The memory 132 may be volatile or non-volatile. It may comprise read-only memory (ROM), random-access memory (RAM), ternary content-addressable memory (TCAM), dynamic random-access memory (DRAM), and static random-access memory (SRAM).

While FIG. 1 shows the user device 130, including only a single processor 136 and a memory 132, they may include any suitable number and combination of processors, e.g., 136 and memories 132, as well as any other necessary components. For simplicity, only one processor, e.g., 136, and one memory, e.g., 132, are shown in FIG. 1.

Network

The network 140 may be any suitable type of wireless and/or wired network including, but not limited to, all or a portion of the Internet, an intranet, a private network, a public network, a peer-to-peer network, the public switched telephone network, a cellular network, a local area network (LAN), a metropolitan area network (MAN), a wide area network (WAN), and a satellite network. The network 140 may be configured to support any suitable type of communication protocol as would be appreciated by one of ordinary skill in the art.

The network 140 may connect the user device 130 with the processor 120 and memory 110 as well as external devices 154. Alternatively, network 140 may connect the user device 130 through the Internet or other large networks. In one or more embodiments, different elements of system 100 may be at different geographic locations and connected through network 140. While shown as a single network 140, the network 140 may comprise a plurality of components of any suitable networking equipment, including but not limited to routers and switches, that allow at least the user device 130 to communicate with the processor 120, memory 110, other user devices, e.g., 130 or external devices 154. Network 140 is not limited to the configuration shown in FIG. 1, which is simply shown in this form for simplicity and explanatory purposes.

Memory

Memory 110 may be any type of storage for storing a computer program comprising instructions 116, energy use data 111, historical use data 114, machine learning models 117, and cache data 118. The memory 110 may be a non-transitory computer-readable medium in operative communication with the processor 120. The memory 110 may be one or more disks, tape drives, or solid-state drives. Alternatively, or in addition, the memory 110 may be one or more cloud storage devices. The memory 110 may be volatile or non-volatile. It may comprise read-only memory (ROM), random-access memory (RAM), ternary content-addressable memory (TCAM), dynamic random-access memory (DRAM), and static random-access memory (SRAM).

The memory 110 stores instructions 116, which, when executed by the processor 120, causes the processor 120 to perform the operations shown in FIGS. 2 and 3 described below. Instructions 116 may comprise any suitable set of instructions, logic, rules, or code. Memory 110 may include storage that may take the form of a database for storing things such as energy use data 111, historical use data 114, and cache data 118. These may be stored and recalled using known protocols such as SQL, XML, and/or any other protocol or language that a user, administrator, or developer of the system 100 wishes to use. The instructions 116, energy use data 111, historical use data 114, cache data 118, and any other information stored in memory 110 may be stored in different forms. The disclosure is not limited to storing the instructions 116, energy use data 111, historical use data 114, cache data 118, and machine learning models 117 as a database.

The memory 110 in one or more embodiments stores energy use data 111. The energy use data 111 may include user device data 112 and activity data 113. As will be described in more detail below regarding FIGS. 2 and 3, the processor 120, when it receives activity information 144 and information regarding current remaining energy 146, stores this data as the user device data 112 and activity data 113 in the energy use data 111. The historical use data 114 and energy use data 111 may be produced by the processor 120 when performing energy use determination 122 and remaining energy determination 124. Any other information may be stored as energy use data 111 in the memory 110 without departing from the disclosure.

The memory 110 may also store one or more machine learning models 117. The machine learning models 117 may be used by the processor 120 when performing remaining energy determination 124 and cache building 126. In one or more embodiments, the machine learning models 117 may take any form, such as artificial neural networks, deep learning, regression analysis, Bayesian networks, and any other form. The machine learning models 117 may be trained using similar device and/or power data obtained from manufacturers, previously stored data, activity information 144, and information regarding current remaining energy 146.

The memory 110 may also store cache data 118. The cache data 118 is any data that an application 137 or the processor 136 of the user device 130 may need to perform the applications 137 and/or actions 142. The cache data 118 may be sent periodically by the processor 120 to the user device 130. In one or more embodiments, less than all of the cached data 118 may be sent by the processor 120 performing cache building 126 as pre-cache data 150 when the current remaining energy is less than a predetermined threshold, as will be described below and in more detail with regards to FIGS. 2 and 3.

Processor

The processor 120 may take the form of any electronic circuitry including, but not limited to, state machines, one or more central processing unit (CPU) chips, logic units, cores (e.g., a multi-core processor), field-programmable gate array (FPGAs), application specific integrated circuits (ASICs), or digital signal processors (DSPs). The processor 120 may be a programmable logic device, a microcontroller, a microprocessor, or any suitable combination of the preceding. The processor 120 is communicatively coupled to and in signal communication with the memory 110. One or more processors make up the processor 120 and are configured to process data, which may be implemented in hardware or software. For example, the processor 120 may be 8-bit, 16-bit, 32-bit, 64-bit, or of any other suitable architecture. The processor 120 may include an arithmetic logic unit (ALU) for performing arithmetic and logic operations, processor registers that supply operands to the ALU and store the results of ALU operations, and a control unit that fetches instructions 116 from memory 110 and executes them by directing the coordinated operations of the ALU, registers and other components.

The processor 120 is in operative communication with memory 110 and configured to implement various instructions 116 stored in memory 110. The processor 120 may be a special-purpose computer designed to implement the instructions 116 and/or functions disclosed herein. For example, the processor 120 may be configured to perform operations, including those described below and shown in FIGS. 2 and 3.

The processor 120, in one or more embodiments, may perform an energy use determination 122, a remaining energy determination 124, and cache building 126 based on instructions 116 stored in the memory 110. The processor 120 may perform more or less operations and may perform the operations described and shown in FIGS. 2 and 3. The specific operations are only examples, and the disclosure is not limited to those described above and below with regards to FIGS. 2 and 3. While a single processor 120 is shown, the processor 120 may include a plurality of processors or other types of computational devices. The operations, e.g., energy use determination 122, remaining energy determination 124, and cache building 126, described herein as being performed by the processor 120 may be performed by a separate processor 120 or software application executed on a single computational device, e.g., processor 120, or they may be located on external devices 154 such as but not limited to separate servers, separate datacenters such as a cloud server. Alternatively, or in addition, the operations, e.g., energy use determination 122, remaining energy determination 124, and cache building 126, may be performed by the processor 136 of one or more of the user devices 130.

In one or more embodiments, the processor 120 receives information regarding current remaining energy 146 from a user device 130 via a network 140 and activity information 144. The processor 120 may receive other information from the user device 130 or other external devices 154, and the disclosure is not limited to just activity information 144 and information regarding current remaining energy 146. The processor 120 takes this information and stores it in the memory 110, as historical use data 114 and energy use data 111. Alternatively, or in addition, when historical use data 114 and energy use data 111 have already been stored in the memory, the activity information 144 and information regarding current remaining energy 146 received from the user device 130 by the processor 120, is used to update or add to the preexisting historical use data 114 and energy use data 111.

The processor 120, after receiving the information regarding current remaining energy 146 and activity information 144, and/or after receiving one or more actions 142 from the user device 130 or user 152, uses this information to perform an energy use determination 122 and remaining energy determination 124. Using this information and the data stored in the memory 110, such as, but not limited to, user device data 112, historical use data 114, the processor 120 determines the current level of energy being used to perform applications 137 and/or actions 142. The processor 120 may also determine which applications 137 and actions 142 the user device 130 is currently performing. This may also include the amount of power each action 142 or application 137 currently uses in one or more embodiments. Alternatively, or in addition, the processor 120 may use the list of actions 142 and applications 137 and compare them to data stored in the memory 110 or in a database on an external device 154 that maps a particular application 137, action 142, and/or user device 130 to a particular power usage. For example, in a non-limiting example, a manufacturer of the user device 130 may note that performing API calls through a particular network 140 may use a specific number of micro joules per second or per API call. In another example, a developer of an application 137 may note that this application, when installed on a particular type of user device 130, typically uses a range of energy per second. Other amounts of energy, measurements of energy, and uses of energy may be determined by the processor 120, and the disclosure is not limited to the above examples.

Using the activity information 144 and information regarding current remaining energy 146, the processor 120 then makes a remaining energy determination 124. When making a remaining energy determination 124, the processor 120 uses user device data 112 along with information regarding current remaining energy 146 to determine the remaining energy of the user device 130 and the amount of time the user device 130 is expected to remain functioning at current usage levels. The processor 120 may determine the amount of time using historical use data 114, activity data 113, or any other useful information.

In one or more embodiments, the processor 120 may use a machine learning model 117 to analyze historical use data 114 and determine how much longer the user device 130 will remain functioning. The machine learning model 117 may analyze the historical use data 114 to make predictions on what applications 137 and/or actions a user device 130 may need to perform. Using those predictions and energy use information for the applications 137 and/or actions 142 obtained from a manufacturer or developer, the processor 120 may determine how much energy will probably be used at any particular time and make a better analysis of the probable amount of time that user device 130 will continue to have enough energy to perform specific applications 137 and/or actions 142.

Once the processor 120 determines the remaining energy, the processor then performs cache building 126. When performing cache building 126, the processor 120 determines what actions 142 and/or applications 137 the user 152 will most likely need the user device 130 to perform during the predetermined amount of time. In one or more embodiments, the processor 120 will also determine which actions 142 and/or applications 137 will probably not be performed or are at least unnecessary to provide acceptable performance to the user 152. The processor 120 may determine that some actions 142 may be required for a user 152 to use an application 137, while other actions for the same application 137 may not be necessary. Such actions 142, for example, may present a more pleasing interface but ultimately do not render the application 137 unusable. Another example may be an application that performs more than one action 142, but in general, during the predetermined time period, the user 152 typically or never performs the other action 142.

Once the actions 142 that are needed and those that are not required are determined by the processor 120, the processor 120 may start cache building 126 to provide pre-cache data 150 to the user device 130 for use by the application. The processor 120 may also use signaling 148 to the user device 130 to provide instructions not to perform one or more actions 142 and/or applications 137 that are determined not to be necessary or are determined not to be actions 142 or applications 137 that the user 152 typically used during the predetermined time period.

The processor 120 uses historical use data 114 and/or the results of using a machine learning model 117 to determine what actions are most probable to be needed by the user device 130 and/or user 152. Any data required to perform the actions 142 or applications 137 that would normally be transferred at or around the time the actions 142 or applications 137 are typically used by the user 152 is prepared as pre-cache data 150. This data is then transferred soon after the determination that the remaining energy is less than the first threshold so that the user device 130 may obtain needed data and store it as application data 133 while the user device 130 still has sufficient power. This also allows the user device 130 to reduce the number of interactions with the network 140, which may prolong the amount of time the user device 130 can continue to operate on its remaining energy. The processor 120 may also, using historical use data 114 and/or other information such as user device data 112, determine a second threshold, which is an energy level at which the user device 130 will no longer have sufficient energy to communicate with the processor 120 or an external device 154 for receiving any pre-cache data 150.

Once the pre-cache data 150 is sent, or prior to it, the processor 120 may provide signaling 148 to the user device 130, instructing it to enter a power-saving mode or to reduce power usage in other manners. For example, signaling 148 may include instructions not to perform one or more actions 142 or applications 137 that were previously determined by the processor 120 to have a low probability of the user 152 needing them. The signaling 148 may include other instructions that reduce energy use or otherwise result in increased efficiency for the user device 130. The disclosure is not limited to a power saving mode or instruction not to perform one or more actions 142 or applications 137.

As an example, in a non-limiting example, if a user typically performs a transaction using the user device 130 during the time period but does not normally check a messaging application, the processor 120 may instruct the user device 130 through signaling 148 to discontinue the messaging application, while the processor 120 also sends pre-cache data 150 needed for performing the application. This pre-cache data 150 may be stored in memory 110 or may be from an external device, e.g., 154. Then, later, if the user performs the transactions, the user device 130 already has the data needed to perform the transaction and does not need to use as much or any energy to communicate through the network 140. Alternatively, if the user decided to use the messaging application, the user device 130 would then request data through the network at that time, using more energy but still remaining potentially functional. Other application 137, actions 142, and/or combinations of actions 142, applications 137, signaling 148, and pre-cache data 150 may be performed by the processor 120 and user device 130, and the disclosure is not limited to those just discussed.

Example System for Pre-caching Content Based on Device Energy Use

Figure 2:
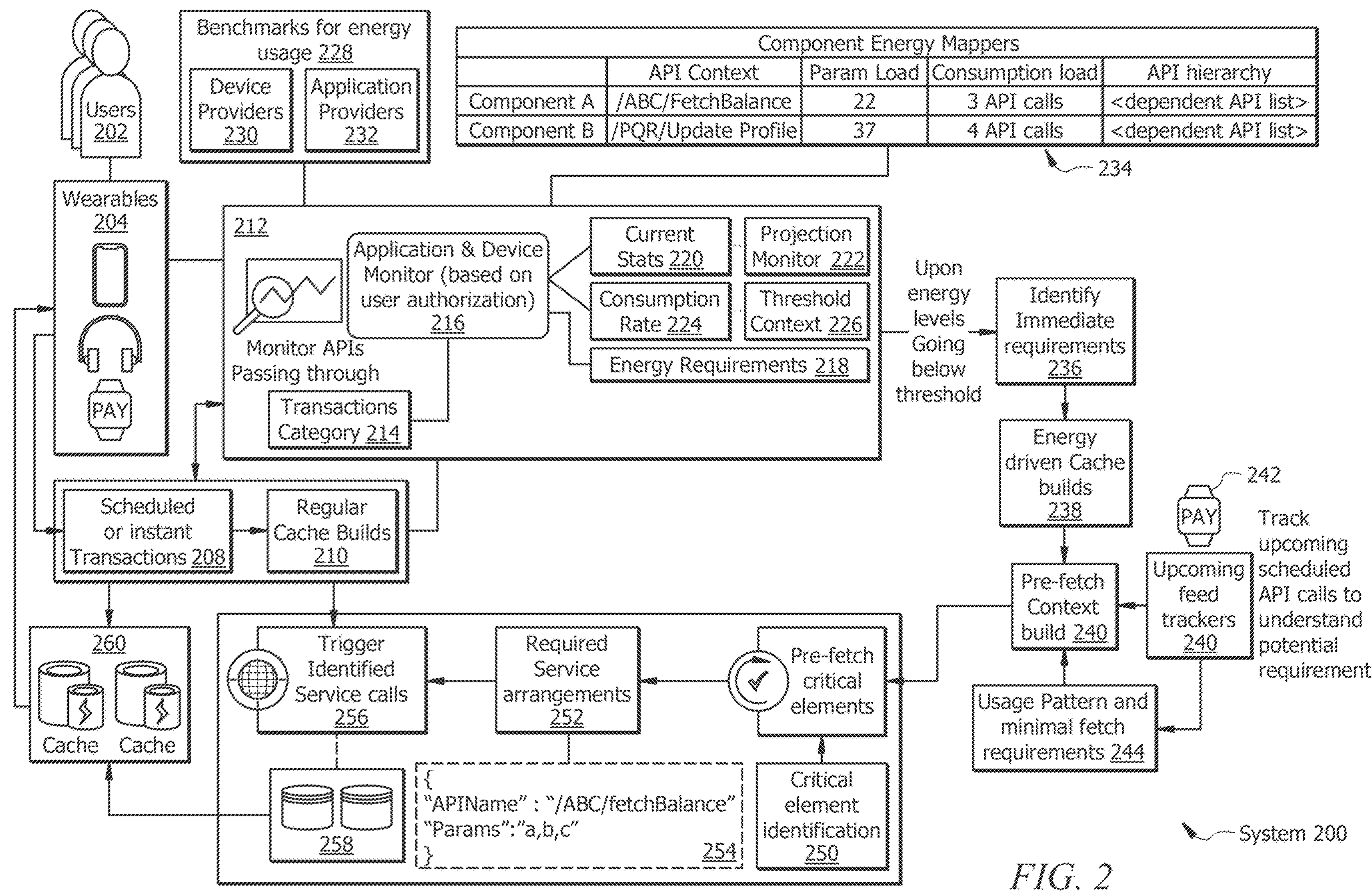
FIG. 2 illustrates one embodiment of an example of a system performing pre-caching of content based on device energy use.

FIG. 2 is a non-limiting example of an exemplary system performing pre-caching of content based on device energy use. FIG. 2 is an example of a specific system and/or application; the disclosure is not limited to the system and/or application shown in FIG. 2. The example of FIG. 2 may be performed by system 100 described above and shown in FIG. 1 or may use any system or components able to perform the example. Similarly, the example of FIG. 2 may be performed using method 300, which will be shown in FIG. 3 and described below or may use any method or operations to perform the example.

The example comprises a system 200 that includes users 202, wearable user devices 204, a processor 212, external device 228, and storage 258, which provide a cache 260 to the wearable user device 204. In one or more embodiments, the components shown in FIG. 2 may be the same as shown in FIG. 1, with the wearable user device 204 may be the same as the user device 130, the processor 212 may be the same as the processor 120, and storage 258 may be the same as the memory 110. In one or more embodiments, these components may differ from those shown in FIG. 1, and the disclosure is not limited to the parts described above and shown in FIG. 1.

The wearable user device 204 may be any portable device that a user 202 may wear or carry, such as but not limited to, smartphones, headphones, and smartwatches. Often, wearable devices 204 utilize batteries or other power sources to function. These wearable user devices 204 may use wireless networks to allow for communication with the processor 212 and other external devices 154 or 228 through one or more networks 140 such as, but not limited to, a cellular network, a Wi-Fi network, near-field communication (NFC), Bluetooth®, satellite network, or any other wireless network.

The user wearable devices 204 during normal operations has scheduled or instant transactions 208. These may be one or more actions 142, as described with regards to FIG. 1, that are performed by the user's wearable device 204 when performing one or more applications 137. Such scheduled or instant transactions 208 may be API calls, requests, and other transfers of data between the wearable user devices 204 and the storage 258. This information is used to perform the regular cache builds 210 that produces the cache 260, which is transmitted back to the user wearable device 204 when a user 202 or application 137 needs data to perform one or more actions 142.

The processor 212, when performing application and device monitoring 216, monitors APIs and other communications that pass through and/or are directed towards the processor 212. The processor 212 receives information on transactions categories 214 as a result of the regular cache builds 210 and receives information directly from wearable user devices 204. The processor 212 uses the received transaction categories 214 and any other data received from the wearable user devices 204 to perform application and device monitoring 216. In one or more embodiments, the user 202 must authorize the processor 212 to perform application and device monitoring 216 and/or install a plugin 138.

The processor 212 receives benchmarks for energy usage from external devices 228, such as those associated with the wearable user device 204, device providers 230, and application providers 232. The device providers 230 and application providers 232 may provide information on how much energy the wearable user device 204 uses performing normal tasks, such as, in a non-limiting example, connecting to a network and transferring data over the network, performing specific actions 142 such as API calls and/or displaying information on the display and any other actions 142. This data and any other data that has been determined based on user wearable devices 204. The energy requirements 218 may take the form shown in table 234 in one or more embodiments. However, the disclosure is not limited to the form shown in table 234; the information may take any form.

The processor 212, when monitoring the transaction categories 214 and other information, determines the current statistics 220 and consumption rate 224. The current statistics 220 indicate the current level of power or percentage of the batteries or energy storage devices of the wearable user devices 204. The consumption rate 224 indicates how fast energy is being used by the current scheduled or instant transactions 208. Using the energy requirements 218, the processor then performs a projection monitor 222 to determine future energy use and levels, and the processor 212 determines a threshold 226.

When the current statistics 220 indicate that the power is below the threshold 226, the processor 212 identifies the immediate requirements 236 for operating the wearable user device 204. This may be the requirements for the current scheduled or instant transactions 208 or may be based on historical use data 114. Based on the current remaining energy, the processor performs energy-driven cache builds 238. This may be different from the regular chance builds 210 in that some data is no longer needed because of the current energy level of the wearable user device 204. The processor 212 also performs upcoming feed tracers 242, tracking such things as upcoming API calls and other predicted requirements to determine usage patterns and minimal fetch requirements 244 to perform a prefetch context build 240. The prefetch context build 240 is used along with a critical element identification 250 to determine prefetch critical elements 246.

The critical element identification 250 may be performed by the processor 212 to determine which applications 137 or actions 142 are essential to maintain a performance level or to perform necessary actions 142 for the user 202. In one or more embodiments, the critical element identification 250 is performed by the processor 212 using one or more machine learning models 117 that have been trained on historical use data 114, scheduled or instant transactions 208, and upcoming feed trackers 242. More or less information may be used for training the machine learning models 117, and/or the critical element identification 250 may be performed without machine learning models 117 without departing from the disclosure.

Once the pre-fetch critical elements 246 are identified by the processor 212, the processor determines the required service arrangements 252. This may include identifying from code associated with the identified elements what actions, such as API calls 254, are needed by the required critical elements. This information is then used to trigger service calls 256 to storage 258 to produce or supplement the cache 260 for sending to wearable user device 204. Once cache 260 is built with both, the regular cache will build 210 and identify service calls 256. It is then sent to the wearable user device 204.

Process for Pre-caching Content Based on Device Energy Use

Figure 3:
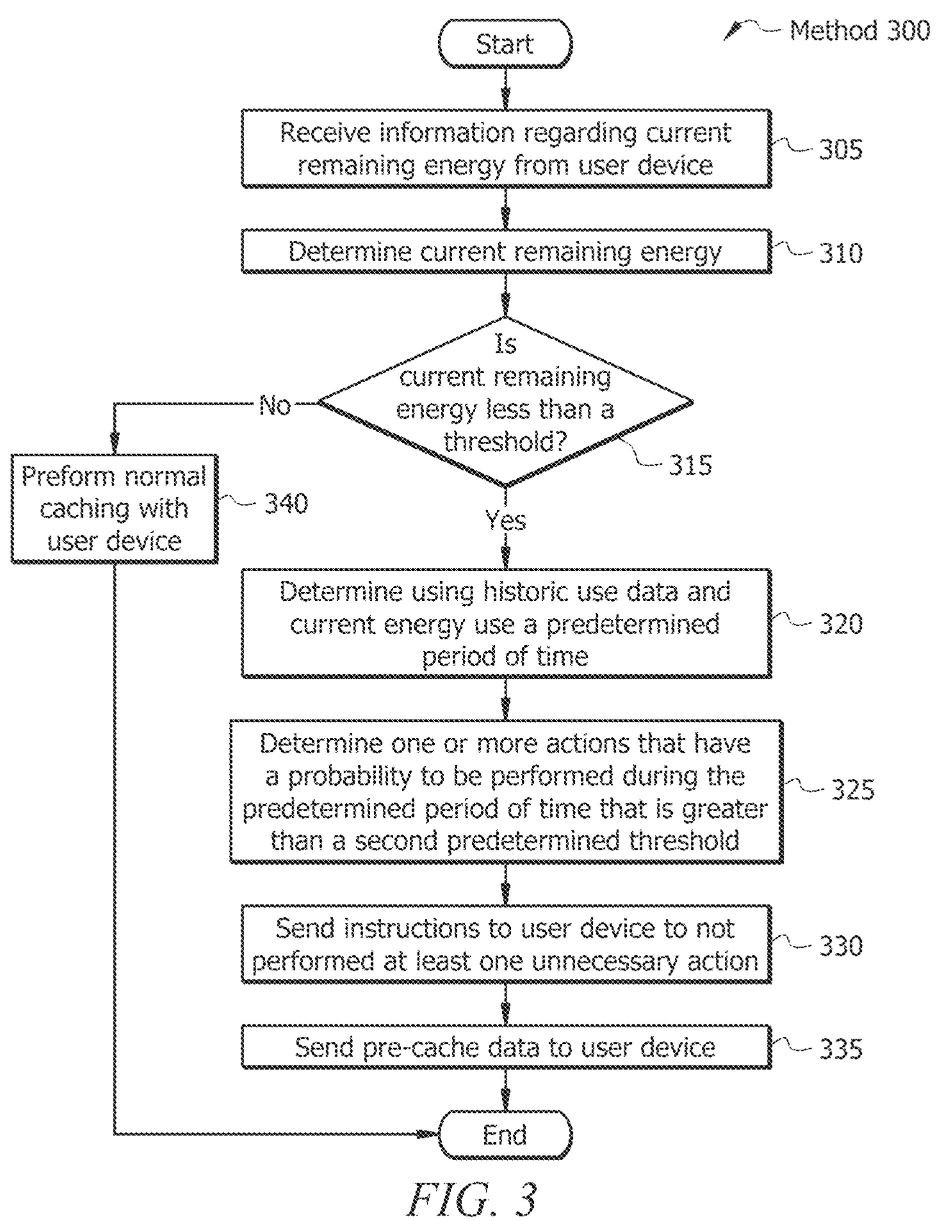
FIG. 3 illustrates one embodiment of a flowchart for pre-caching content based on device energy use.

FIG. 3 is a flowchart of an embodiment of method 300 performed by a processor 120 for pre-caching content based on the current remaining energy 146 and activity information 144 of a user device 130. The processor 120 may execute instructions 116 stored in the memory 110, which employs method 300 for determining what cache data 118 to send to the user device 130 based on its current remaining energy 146 and future needs to perform applications 137 and actions 142.

Method 300 begins at operation 305 when processor 120 receives the information regarding current remaining energy 146 from the user device 130. The processor 120 may also receive activity information 144. The processor 120 may continuously or periodically receive information regarding current remaining energy 146 and/or activity information 144 from the user device 130 or another external device 154. In one or more embodiments, the user device 130 or another external device, e.g., 154, may send information regarding current remaining energy 146 whenever one or more actions 142 are performed by the user device 130. The information regarding current remaining energy 146 may include such things as the remaining energy of a battery or other power source that is part of the user device 130. This may be in the form of a percentage or an amount of remaining charge or voltage. The information regarding current remaining energy 146 may take any form and is not limited to a percentage or amount of remaining charge or voltage.

Using the activity information 144 and information regarding current remaining energy 146, the processor 120 then determines the current remaining energy in operation 310. The processor uses the energy use data 111 stored in the memory 110, including both user device data 112 and activity data 113, to determine the remaining energy. The user device data 112, in one or more embodiments, may include data received from a device manufacturer or other sources describing how much energy the user device 130 uses to perform various actions 142. Once the remaining energy is determined by the processor 120 in operation 310, the processor 120 determines if the current remaining energy is less than a threshold in operation 315.

In operation 315, processor 120 uses the results of the energy use determination 122 performed in operation 310 and compares the current remaining energy of the user device 130 with a predetermined threshold. This predetermined threshold may be any value or percentage set by a device manufacturer, a user, an administrator, or other concerned party. The threshold is an amount where the concerned party determines that actions should be taken to ensure the devices continue functioning to at least perform one or more actions 142. The threshold in one or more embodiments may be any percentage or amount such as but not limited to 75%, 50%, 30%, or any other percentage or corresponding amount of charge or other measurement of remaining energy in the user device 130.

When the processor 120 determines that the remaining energy is greater than or equal to the threshold in operation 315, method 300 proceeds to operation 340. In operation 340, normal caching is performed with the user device 130. Normal caching may be any data routinely shared between an external device 154 or the processor 120 and shared either as needed or periodically. Alternatively, normal caching may be performed when specific actions 142 are taken by the user device 130.

If the processor 120 instead determines in operation 315 that the remaining energy is less than the threshold, the method proceeds to operation 320. In operation 320, the processor 120 then determines a predetermined period of time using historical use data 114 and information regarding current remaining energy 146. This predetermined period of time is when the processor 120 determines that the user device 130 may still be operational or when the user device 130 may need to undergo a shutdown procedure to avoid unnecessary data loss or damage to the user device 130. This predetermined period of time may be a second period of time associated with when the current remaining energy 146 is estimated to be less than a second predetermined threshold. The second predetermined threshold may be set by a user, administrator, manufacturer, or other interested party. It may be based on a determined level of energy where the user device 130 should be shut down in order to avoid damage or loss of data. In one or more embodiments, the second threshold may be an energy level where the user device 130 no longer has sufficient energy to communicate with the processor. Alternatively, in one or more embodiments, the predetermined amount of time may be a set number of hours that the processor 120 considerers, regardless of the remaining energy use.

Once the predetermined period of time is determined in operation 320, the processor 120 determines one or more actions that have a probability of being performed during the predetermined period of time that is greater than a second predetermined threshold in operation 325. In one or more embodiments, this is done by analyzing historical use data 114 to determine which actions 142 were performed by the user device 130 during the predetermined period of time. For example, in a non-limiting example, the processor 120 may determine that every day at a preset time, the user 152 looks at an account balance, so the application 137 that provides that account balance to the user 152 would need to remain functioning and would require data such as the account balance transferred to it in the pre-cached data 150.

Alternatively, or in addition, in one or more embodiments, the processor 120 may use one or more machine learning models 117 to analyze the historical use data 114 and activity information 144 to determine the most probable actions a user 152 may need the user device 130 to perform. Using the historical use data 114, the processor 120 performing one or more machine learning models may determine the probability that specific actions 142 and/or applications 137 will be performed; these probabilities may then be compared with a second threshold. This second threshold may be set by a user, administrator, or other party and may be determined as a percentage that indicates that an action 142 or application 137 is more likely to be needed. For example, the threshold might be 50% or 70% in a non-limiting example. Additionally, the second threshold may be changed depending on the current remaining energy determined in operation 310. For example, the processor 120 may determine that when the power is at 80%, any activities 142 or applications 137 that have a probability higher than 50% should have data pre-cached, while when the power level drops to 50%, the second threshold may be set at 75% to ensure that no-unnecessary data is being transmitted. The specific percentages are examples, and the disclosure is not limited to them.

Once the processor 120 determines which actions 142 may be performed during the predetermined period of time in operation 325, the processor 120 optionally sends instructions to the user device 130 to not perform at least one unnecessary action 142 in operation 330. The instructions are sent in the signaling 148 to the user device 130. When the processor 120 sends the instructions, it may instruct the user device 130 not to perform one or more applications 137 or one or more actions 142 that are not necessary or generally not requested by the user 152 during the predetermined period of time. The signaling 148 sent in operation 330 may also contain such things as instructions to reduce power usage, to reduce the number of API calls, to reduce communications through the network 140, reduce display brightness, and/or any other activities that will reduce and/or prolong the functionality of the user device 130 given its current remaining energy 146.

The processor 120 may send pre-cached data 150 to the user device 130 in operation 335 either concurrently or after sending instructions in operation 330. Alternatively, if no instructions are sent, processor 120 may send pre-cached data to the user device 130 after determining one or more actions in operation 325. The pre-cached data 150 includes any data that the user 152 or application 137 may need. In one or more embodiments, this may be less than all of the data that would normally cache to the processor 136 and/or application 137. For example, if the user 152 generally only checks their balance in an application 137, other data that is usually cached to the application 137 may not be needed.

Once either operation 335 or 340 is completed, the method 300 ends. Alternatively, the method 300 may return to operation 305 and continue monitoring the information regarding current remaining energy 146 of the user device 130 as well as the activity information 144. While continuously monitoring the processor 120 may determine what, if anything, to send to the device as pre-cache data 150 and continue monitoring until the user device 130 until the user device 130 shuts down or no longer has enough energy to communicate with processor 120 and method 300 of FIG. 2 ends.

The present examples are to be considered illustrative and not restrictive, and the intention is not to be limited to the details given herein. For example, the various elements or components may be combined or integrated into another system, or certain features may be omitted or not implemented.

While several embodiments have been provided in the present disclosure, it should be understood that the disclosed systems and methods might be embodied in many other specific forms without departing from the spirit or scope of the present disclosure. The present examples are to be considered illustrative and not restrictive, and the intention is not to be limited to the details given herein. For example, the various elements or components may be combined or integrated into another system, or certain features may be omitted or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

To aid the Patent Office and any readers of any patent issued on this application in interpreting the claims appended hereto, applicants note that they do not intend any of the appended claims to invoke 35 U.S. C. § 140(f) as it exists on the date of filing hereof unless the words "means for" or "operation for" are explicitly used in the particular claim.

The invention claimed is:

1. A system, comprising:

a memory configured to store historical use data, energy use data, and pre-cache data, wherein:
- the historical use data comprises activity information for a user device over a first predetermined period of time;
- the energy use data comprises energy use information for each of a plurality of actions performed by a user device when executing at least one application; and
- the pre-cache data comprises information used by the user device to perform each of the plurality of actions; and a processor operably coupled to the memory and configured to:
- receive information regarding current remaining energy of the user device;
- compare the current remaining energy to a predetermined threshold; and
- when the current remaining energy is less than the predetermined threshold:
  - determine a second period of time associated with when the current remaining energy is estimated to be less than a second predetermined threshold, wherein the second period of time is determined based at least in part upon the historical use data and energy use data;
  - determine using the historical use data, at least one action of the plurality of actions, wherein the at least one action is predicted to be performed by the user device during the second period of time; and
  - send to the user device the pre-cache data used by the user device to perform the at least one action.

2. The system of claim 1, wherein the processor is further configured to: receive from the user device, activity information associated with the user device; and update the historical use data with the activity information.

3. The system of claim 2, wherein the activity information is received from a monitoring application installed on the user device.

4. The system of claim 3, wherein the energy use information for each of the plurality of actions is obtained by the monitoring application when the user device performs each of the plurality of actions.

5. The system of claim 1, wherein when the current remaining energy is less than the predetermined threshold, the processor is further configured to:

determine, using the historical use data, at least one unnecessary action of the plurality of actions; and cause the at least one unnecessary action to not be performed by the user device.

6. The system of claim 1, wherein the at least one action comprises at least one application programming interface (API) call.

7. The system of claim 1, wherein the energy use information for each of the plurality of actions comprises benchmarks associated with the at least one application.

8. The system of claim 1, wherein the second predetermined threshold is an energy level at which the user device will no longer have sufficient energy to communicate with the processor.

9. A method comprising:
- receiving from a user device, information regarding current remaining energy of the user device;
- comparing the current remaining energy to a predetermined threshold; and
- when the current remaining energy is less than the predetermined threshold:
  - determining a second period of time associated with when the current remaining energy is estimated to be less than a second predetermined threshold, wherein the second period of time is determined based at least in part upon historical use data for the user device and energy use data for the user device;
  - determining using the historical use data, at least one action of a plurality of actions, wherein the at least one action is predicted to be performed by the user device during the second period of time; and
  - sending to the user device, pre-cache data used by the user device to perform the at least one action.

10. The method of claim 9, further comprising: receiving from the user device, activity information associated with the user device; and updating the historical use data with the activity information.

11. The method of claim 10, wherein the activity information is received from a monitoring application installed on the user device.

12. The method of claim 11, wherein the energy use data for each of the plurality of actions is obtained by the monitoring application when the user device performs each of the plurality of actions.

13. The method of claim 9, wherein when the current remaining energy is less than the predetermined threshold, the method further comprises:
- determining, using the historical use data, at least one unnecessary action of the plurality of actions; and
- causing the at least one unnecessary action to not be performed by the user device.

14. The method of claim 9, wherein the at least one action comprises at least one application programming interface (API) call.

15. A non-transitory computer-readable medium storing instructions that, when executed by a processor, cause the processor to:
- receive from a user device, information regarding current remaining energy of the user device;
- compare the current remaining energy to a predetermined threshold; and
- when the current remaining energy is less than the predetermined threshold:
  - determine a second period of time associated with when the current remaining energy is estimated to be less than a second predetermined threshold, wherein the second period of time is determined based at least in part upon historical use data for the user device and energy use data for the user device;
  - determine using the historical use data, at least one action of a plurality of actions, wherein the at least one action is predicted to be performed by the user device during the second period of time; and
  - send to the user device, pre-cache data used by the user device to perform the at least one action.

16. The non-transitory computer-readable medium of claim 15, wherein the instructions further cause the processor to:
- receive from the user device, activity information associated with the user device; and
- update the historical use data with the activity information.

17. The non-transitory computer-readable medium of claim 15, wherein when the current remaining energy is less than the predetermined threshold, the processor is further configured to:
- determine, using the historical use data, at least one unnecessary action of the plurality of actions; and
- cause the at least one unnecessary action to not be performed by the user device.

18. The non-transitory computer-readable medium of claim 15, wherein the second predetermined threshold is an energy level at which the user device will no longer have sufficient energy to communicate with the processor.

19. The non-transitory computer-readable medium of claim 15, wherein the at least one action comprises at least one application programming interface (API) call.

20. The non-transitory computer-readable medium of claim 15, wherein the energy use data for each of the plurality of actions comprises benchmarks for an application associated with the plurality of actions.

* * * * *